United States Patent [19]
Hlibowicki

[11] Patent Number: 5,596,650
[45] Date of Patent: Jan. 21, 1997

[54] EQUALIZING CIRCUIT FOR A LOUDSPEAKER SYSTEM

[75] Inventor: Stefan R. Hlibowicki, Scarborough, Canada

[73] Assignee: Audio Products International Corp., Scarborough, Canada

[21] Appl. No.: 234,736

[22] Filed: Apr. 29, 1994

[51] Int. Cl.$^6$ ................................................. H03G 5/00
[52] U.S. Cl. .................... 381/103; 381/96; 381/98
[58] Field of Search ............................ 381/71, 59, 96, 381/98, 103, 99, 100, 101, 102; 333/28 T, 28 R

[56] References Cited

U.S. PATENT DOCUMENTS

| | | | |
|---|---|---|---|
| 3,755,749 | 8/1973 | Van Ryswyk et al. | 381/103 |
| 4,458,362 | 7/1984 | Berkovitz et al. | 381/103 |
| 4,468,627 | 8/1984 | Fushiki | 333/28 R |
| 4,481,662 | 11/1984 | Long et al. | 381/103 |
| 4,888,789 | 12/1989 | Orban | 381/78 |
| 5,117,401 | 5/1992 | Feintuch | 381/71 |
| 5,384,856 | 1/1995 | Kyouno et al. | 381/103 |

OTHER PUBLICATIONS

The Mirror Filter—A New Basis for Reducing Nonlinear Distortion and Equalizing Response in Woofer Systems—By: Wolfgang Klippel J. Audio Eng. Soc., vol. 40 No. 9, 1992 Sep.

*Primary Examiner*—William Cumming
*Assistant Examiner*—Vivian Chang
*Attorney, Agent, or Firm*—Bereskin & Parr

[57] ABSTRACT

The invention provides an equalizing circuit for a loudspeaker system. The circuit includes an output amplifier connected to the circuit output, and a feedback amplifier connected to the circuit input. A plurality of filter elements are connected in series to the output of the feedback amplifier and the outputs of each of the filter elements are connected to inputs of both the output amplifier and the feedback amplifier, the amplifier inputs defining scaling factors for achieving a desired target response function for the loudspeaker system. The circuit generates a circuit transfer function having a numerator and a denominator. The numerator defines sufficient zeroes for cancelling all poles of the known transfer function of the loudspeaker system. As a result, when the circuit is connected in cascade to the loudspeaker system, the desired response function can be obtained.

10 Claims, 6 Drawing Sheets

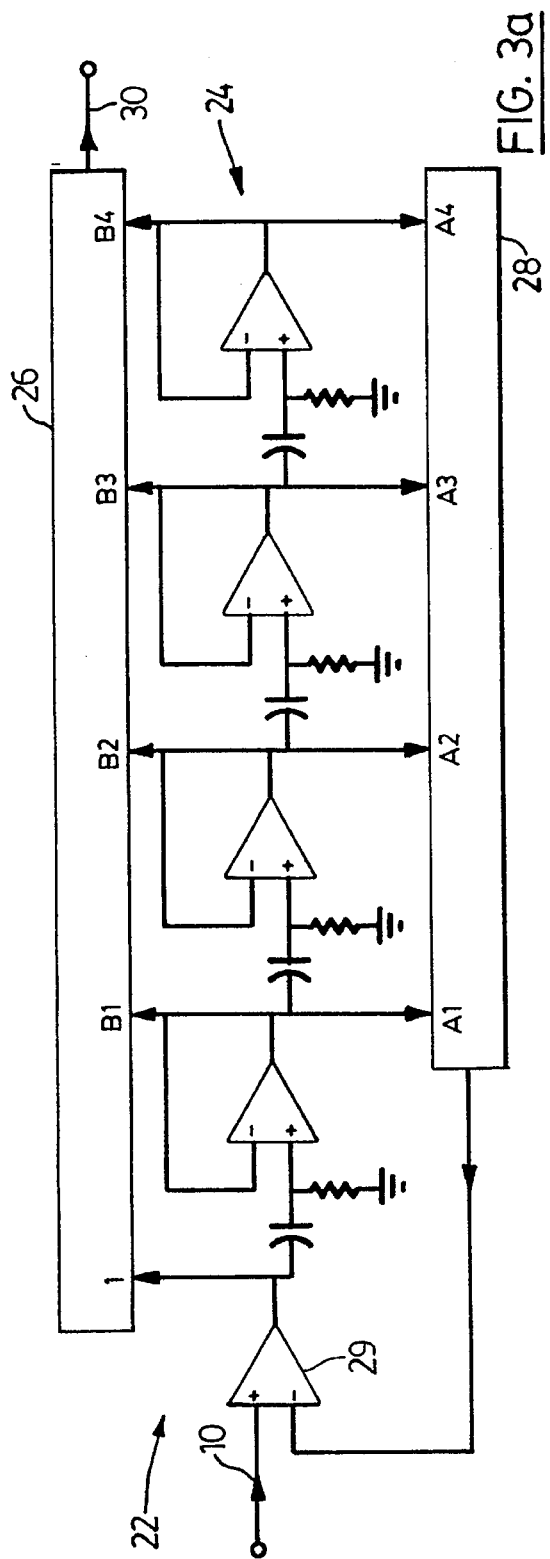
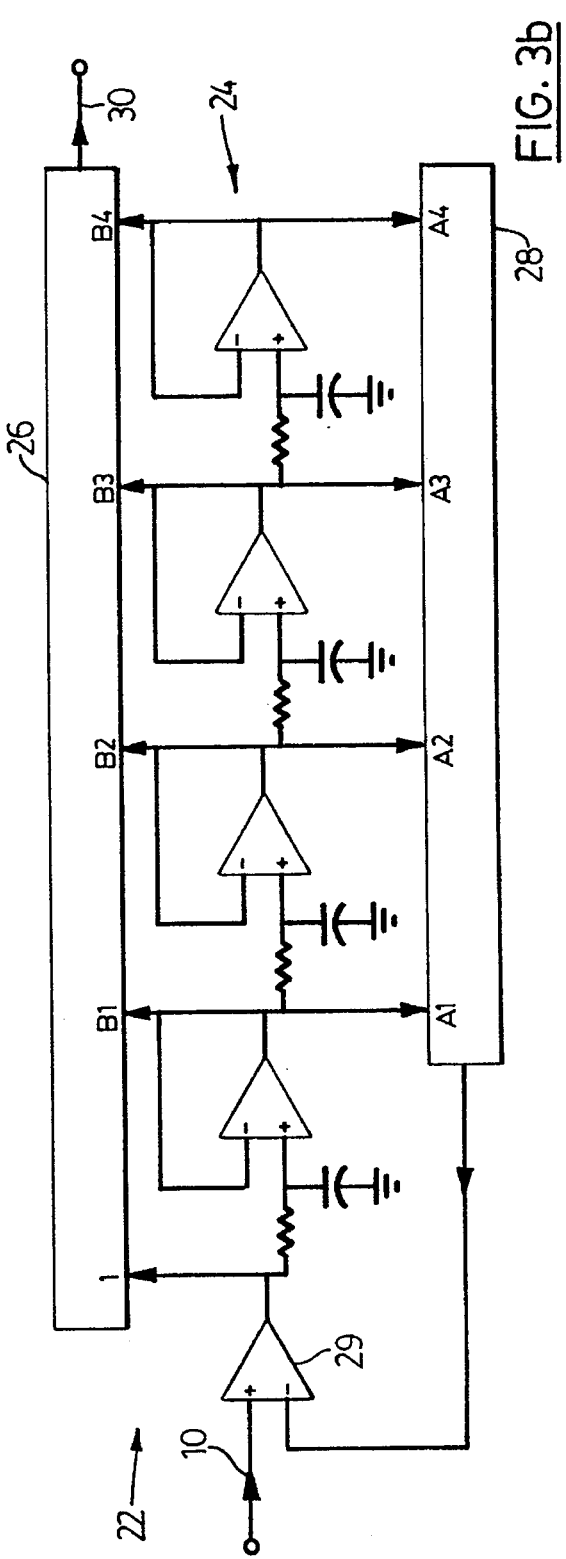

EQUALIZING CIRCUIT FOR A LOUDSPEAKER SYSTEM

FIELD OF THE INVENTION

The present invention relates to equalizing circuits, and in particular to equalizing circuits for loudspeaker systems and the like.

BACKGROUND OF THE INVENTION

In designing loudspeaker systems, there are two known methods for achieving a desired frequency response characteristic at low frequencies. The first method involves making changes to the physical parameters of the speaker system itself. For instance, a driver of pre-determined size is selected for installation in a speaker box of pre-determined size in order to obtain a desired frequency response. A problem with this first method is that the required driver and speaker box selections are often either physically impractical, or are not economically feasible. The second method involves the connection of an equalizing circuit in cascade with the amplifier that powers the loudspeaker. This offers the speaker designer greater freedom in selecting physical components by leaving the final response adjustments to the equalizing circuit.

Conventional equalizing circuits operate by boosting the lower part of the system response through the use of a simple resonating circuit, an underdamped high pass filter, or other known filters. One problem with such equalizing circuits is that the desired system frequency response is achieved with only limited accuracy. The equalizing circuit is only successful at approximating the desired frequency response, it does not succeed in precisely equalizing the response. Furthermore, the addition of such equalizing circuits to the loudspeaker system increases the total system order and can negatively influence the quality of the reproduced sound.

A possible solution to these problems is to utilize two state-variable, or two biquad filters. However, this approach leads to significantly more complex circuitry which increases costs, and further complicates the system.

What is needed is an equalizing circuit for accurately achieving a desired target frequency response for a loudspeaker system at low frequencies. Furthermore, there is a need for such a circuit to incorporate a relatively simple combination of components. Finally, there is a need for a method for designing such a circuit for a loudspeaker system of any order.

SUMMARY OF THE INVENTION

The present invention provides a circuit for equalizing the frequency response of a loudspeaker system at low frequencies.

The invention recognizes that a process of pole-zero cancellation can be used to develop a simplified equation for an equalizing circuit. The invention further recognizes that a model equalizing circuit would need to be formulated to contain two distinct sets of polynomial coefficients for its circuit components to permit zeroes in the circuit transfer function to cancel poles in the loudspeaker system transfer function.

In accordance with one aspect of the present invention there is provided a circuit for use with a loudspeaker system, the loudspeaker system having a known loudspeaker transfer function which has a polynomial denominator defining one or more poles and which has a pass characteristic passing frequencies above a loudspeaker cutoff frequency, said circuit being adapted for generating a desired target response function having a target cutoff frequency below the loudspeaker cutoff frequency, the circuit comprising:

circuit means for generating a circuit transfer function having both a numerator and a denominator, wherein the numerator defines sufficient zeroes for cancelling all of the poles of the transfer function of the loudspeaker system and wherein the poles of the target transfer function are such as to provide a target cutoff frequency below the loudspeaker cutoff frequency whereby the desired target response function obtained by combining the circuit transfer function and the loudspeaker transfer function. The transfer function of the loudspeaker systems is of order n and defines n poles, wherein the denominator and numerator of the transfer function of the circuit are both of order m and respectfully define m zeroes and m poles. The circuit comprises:

a circuit input and a circuit output;

an output summing and scaling amplifier having an output connected to the circuit output;

a feedback summing and scaling amplifier having an input connected to the circuit input; and a plurality of filter elements connected in series to the output of the feedback amplifier; wherein the output of the feedback amplifier and the outputs of each of the filter elements are connected to inputs of both the output amplifier and the feedback amplifier, said amplifier inputs defining scaling factors for achieving the desired target response function.

Preferably, the circuit is provided in combination with a loudspeaker system. The transfer function of the circuit includes a denominator and numerator both of order m, where m is greater than the order n of the transfer function of the loudspeaker system. As a result, all of the poles of the loudspeaker system transfer function can be cancelled by the zeroes in the equalizing circuit transfer function.

Preferably, the equalizing circuit of the present invention has a plurality of first-order filter networks each comprising a reactive element and a resistive element. Each of the networks are connected in series and the outputs of each of the networks are sent to the output summing and scaling amplifier and the feedback summing and scaling amplifier. The output summing and scaling amplifier produces the output of the circuit and the feedback summing and scaling amplifier produces the negative feedback of the circuit. The output and feedback summing and scaling amplifiers each define a set of distinct polynomial coefficients. When the Laplace transform of the equalized loudspeaker system is calculated, the technique of pole-zero cancellation is used to obtain formulas for determining the values of the polynomial coefficients and thus the values for the circuit components. Using these formulas an equalizing circuit may be designed for any order of loudspeaker system.

BRIEF DESCRIPTION OF THE FIGURES

For a better understanding of the present invention and to show more clearly how it may be carried into effect, reference will now be made, by way of example, to the accompanying drawings. The drawings show a preferred embodiment of the present invention, in which:

FIGS. 3(a) and (b) are block diagrams of a model equalizing circuit, in high-pass and low-pass configurations respectively, for a fourth order system in accordance with present invention;

DETAILED DESCRIPTION OF THE PREFERRED EMBODIMENT

Figure 1:
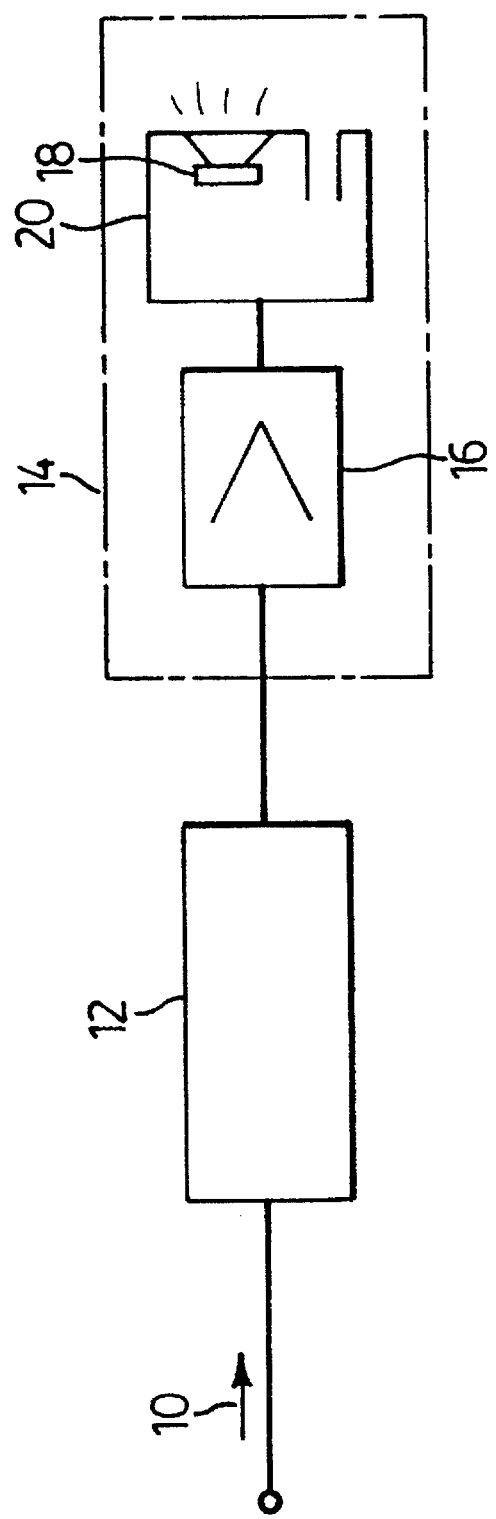
FIG. 1 is a block diagram of an electronically equalized loudspeaker system in accordance with the present invention.

A block diagram depicting an electronically equalized loudspeaker system is provided in FIG. 1. The diagram shows an audio signal input 10 being connected to an equalizing circuit 12 which in turn is connected to a loudspeaker system 14. The loudspeaker system includes an amplifier 16 and one or more drivers or individual loudspeakers 18 contained within a speaker box 20.

The frequency response of the loudspeaker system 14 is influenced by the system's physical parameters. The number of drivers 18 and the size of each driver 18 affect the frequency response. Also, the speaker box 20 size and configuration affects the frequency response. For instance, a sealed speaker box 20 would perform differently than a vented speaker box 20.

METHOD OF EQUALIZING nTH ORDER SYSTEMS

A speaker 18 in a cabinet 20 is a system which can be characterized by its frequency response and described using filter theory tools. Analysis of speaker physics reveals that at low frequencies the speaker behaves like a high-pass filter. This is related to the speaker's inability to reproduce constant pressure. In this case constant means constant as a function of time or, in other words, having no DC components. It follows that the transfer function LS(s) for a loudspeaker system 14 can be expressed in normalized form as follows:

$$LS(s) = \frac{1}{1 + \delta_1 \cdot (\Omega_0/s) + \delta_2 \cdot (\Omega_0/s)^2 + \ldots + \delta_{n-1} \cdot (\Omega_0/s)^{n-1} + (\Omega_0/s)^n}$$

where:

$\delta_1, \delta_2, \ldots \delta_{n-1}$ are polynomial coefficients related to speaker physical parameters (dimensionless);

$\delta_0$ is a reference angular frequency (not resonance); and n is the order of the loudspeaker system 14.

The transfer function LS(s) represents the ratio of the pressure created by the speaker 18 to a reference pressure achievable at high frequencies. It means that as $s \to \infty$ then $LS(s) \to 1$. The shape of a speaker frequency response depends on the coefficients $\delta$ which values can not always be chosen freely. If one wants to build a loudspeaker system 14 having a transfer function different than allowed by its construction then one must use active equalization. This can be provided by a filter circuit connected in series with the speaker system 14, as indicated at 12 in FIG. 1. Then, the resultant target frequency response can meet the desired specification.

It is known that the transfer function for an equalizing circuit 12 can be expressed as a ratio of two polynomials, with the numerator determining "zeroes" and the denominator determining "poles" in the response characteristic. Known techniques, while taking the loudspeaker system response characteristics into account, make no attempt to match the zeroes of the filter characteristic with the poles of the loudspeaker system transfer function. Consequently, the combined transfer function is very complicated, and will often only give an approximation to the desired response.

The present inventor has determined that the poles inherent in the loudspeaker system response should be considered carefully when configuring the equalizing circuit 12. More particularly, the equalizing circuit 12 should be constructed to generate a circuit transfer function having zeroes that cancel out all of the poles of the loudspeaker transfer function. This then gives an inherently simple overall transfer function, and enables its parameters to be selected to give the desired response.

There is no theoretical limitation for the shape of the target response however its order can not be smaller than the speaker order n. Otherwise, the equalizer gain at very low frequencies would have to reach an infinite value. If one assumes that the target transfer function for the overall system is a high-pass filter transfer function of m order with reference frequency $\Omega_t$ and defined by a set of coefficients $\mu$, then the target transfer function F(s) may be represented as follows:

$$F(s) = \frac{1}{1 + \mu_1 \cdot (\Omega_t/s) + \mu_2 \cdot (\Omega_t/s)^2 + \ldots + \mu_{m-1} \cdot (\Omega_t/s)^{m-1} + (\Omega_t/s)^m}$$

where:

$\mu_1, \mu_2, \ldots \mu_{m-1}$ are target polynomial coefficients;

$\Omega_t$ is a reference angular frequency; and m is the overall system order.

$\Omega_t$ is a reference frequency that can be selected to choose the position of the response characteristic along the frequency spectrum without altering its profile.

As the equalizing circuit 12 is connected in series with the speaker system 14, its transfer function ES(s) must have the following form to cancel all poles of the loudspeaker system function LS(s) to arrive at the target transfer function F(s):

$$ES(s) = \frac{1 + \delta_1 \cdot (\Omega_0/s) + \delta_2 \cdot (\Omega_0/s)^2 + \ldots + \delta_{n-1} \cdot (\Omega_0/s)^{n-1} + (\Omega_0/s)^n}{1 + \mu_1 \cdot (\Omega_t/s) + \mu_2 \cdot (\Omega_t/s)^2 + \ldots + \mu_{m-1} \cdot (\Omega_t/s)^{m-1} + (\Omega_t/s)^m}$$

If n>m, then at very low frequencies:

$$\lim_{s \to 0} ES(s) = \frac{\Omega_0^n}{\Omega_t^m} \cdot s^{m-n} \to \infty$$

Practical applications are therefore limited to cases where n<=m. The following detailed analysis relates to such an equalizing circuit 12.

Figure 2:
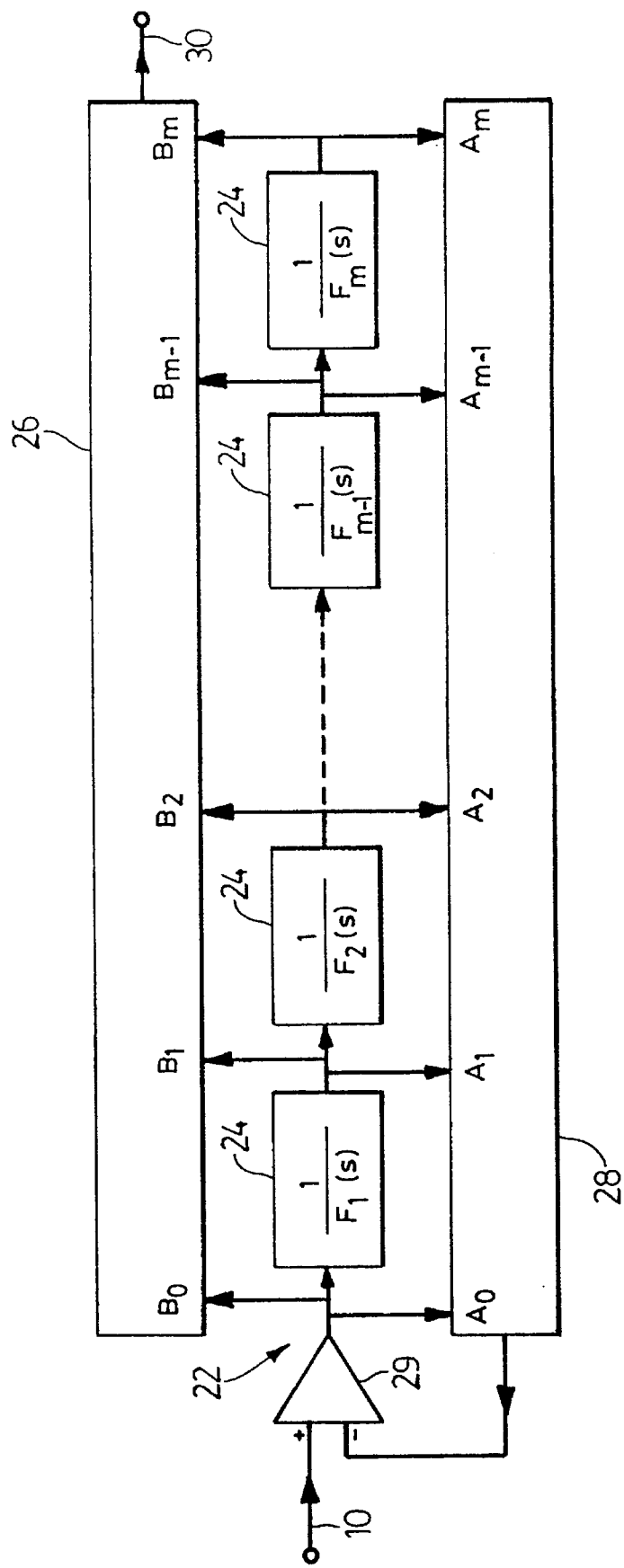
FIG. 2 is a block diagram of a model equalizing circuit in accordance with the present invention.

FIG. 2 shows the proposed topology of an m order model equalizing circuit 22. This model equalizing circuit 22 contains m blocks of filters 1/F(s) indicated at 24, an output summing and scaling amplifier 26, and a feedback summing and scaling amplifier 28 that utilizes an input differential amplifier 29 with unity gain. These are shown between the input 10 and an output 30 for the model equalizing circuit 22. After performing simple routine calculations it can be demonstrated that the model equalizing circuit's 22 transfer function EQ(s) is represented by the following equation:

$$EQ(s) = \frac{B_0 \cdot \prod_{i=1}^{m} F_i(s) + B_1 \cdot \prod_{i=2}^{m} F_i(s) + \ldots + B_{m-1} \cdot F_m(s) + B_m}{(1+A_0) \cdot \prod_{i=1}^{m} F_i(s) + A_1 \cdot \prod_{i=1}^{m} F_i(s) + \ldots + A_{m-1} \cdot F_m(s) + A_m}$$

where A,B are scaling coefficients.

Filters 24 are first order high or low pass filters. Any combination of them in the system can be used. If a filter 24 has a high-pass configuration then its transfer function has the form:

$$1/F(s) = \frac{1}{1+(\Omega/s)}$$

and for a low-pass filter $$1/F(s) = \frac{1}{1+(s/\Omega)}$$

The filter blocks 24 are labelled as 1/F(s) so $F_i(s)$ can be written in simpler form. Depending on what kind of filter 24 (high or low-pass) is chosen (i.e. so $F_i(s)$ is the denominator), then:

$F_i(s)=1+(\Omega_i/s)$ for high-pass, or $F_i(s)=1+(s/\Omega_i)$ for low-pass

The numerator and the denominator of the equation for EQ(s) contain the same terms $1+(\Omega_i/s)$ or $1+(s/\Omega_i)$ depending on the filter type being used in a particular block 24, and can contain some high-pass and some low-pass filter types together. If the term $1+(s/\Omega_i)$ exists in the EQ(s) expression, it can be converted to $1+(\Omega_i/s)$ by multiplying the numerator and the denominator of that expression by $\Omega_i/s$ and this can be done for every term of that kind. As a consequence the numerator and the denominator need only contain terms $\Omega_i/s$ and can be represented as m order polynomials of 1/s. This step allows a comparison of the expressions for ES(s) and EQ(s) which is necessary to find values for scaling coefficients $A_i$ and $B_i$ in the model equalizer 22.

METHOD OF EQUALIZING A 4TH ORDER SYSTEM

The above procedure can be demonstrated using a fourth order system as an example. Assuming that all of the elementary filters 24 are high-pass first order filters one can write the equalizer 22 transfer function EQ(s) as a ratio of a numerator N(s) and denominator D(s):

$$EQ(s) = \frac{N(s)}{D(s)}$$

where:

$N(s) = B_0 \cdot (1 + \Omega_1/s) \cdot (1 + \Omega_2/s) \cdot (1 + \Omega_3/s) \cdot (1 + \Omega_4/s) +$ $\qquad B_1 \cdot (1 + \Omega_2/s) \cdot (1 + \Omega_3/s) \cdot (1 + \Omega_4/s) +$ $\qquad B_2 \cdot (1 + \Omega_3/s) \cdot (1 + \Omega_4/s) + B_3 \cdot (1 + \Omega_4/s) + B_4$ and $D(s) = (1 + A_0) \cdot (1 + \Omega_1/s) \cdot (1 + \Omega_2/s) \cdot (1 + \Omega_3/s) \cdot$ $\qquad (1 + \Omega_4/s) + A_1 \cdot (1 + \Omega_2/s) \cdot (1 + \Omega_3/s) \cdot (1 + \Omega_4/s) +$ $\qquad A_2 \cdot (1 + \Omega_3/s) \cdot (1 + \Omega_4/s) + A_3 \cdot (1 + \Omega_4/s) + A_4$ Both N(s) and D(s) are 4th order polynomials of 1/s. It does not limit the model equalizer 22 versatility if one assumes that $\Omega_1=\Omega_2=\Omega_3=\Omega_4=\Omega$ This assumption is not absolutely necessary but simplifies calculations. It also enables the model circuit 22 to have equal component values, which is advantageous. If so then:

$N(s) = (B_0 + B_1 + B_2 + B_3 + B4) + (4B_0 + 3B_1 + 2B_2 + B_3) \cdot$ $\qquad (\Omega/s) + (6B_0 + 3B_1 + B_2) \cdot (\Omega/s)^2 + (4B_0 + B_1) \cdot (\Omega/s)^3 +$ $\qquad B_0 \cdot (\Omega/s)^4$ and $D(s) = ((1 + A_0) + A_1 + A_2 + A_3 + A_4) + (4(1 + A_0) + 3A_1 +$ $\qquad 2A_2 + A_3) \cdot (\Omega/s) + (6(1 + A_0) + 3A_1 + A_2) \cdot (\Omega/s)^2 +$ $\qquad (4(1 + A_0) + A_1) \cdot (\Omega/s)^3 + (1 + A_0) \cdot (\Omega/s)^4$ The above equations for N(s) and D(s) can be transformed further by introducing $\Omega_0$ to N(s) and $\Omega_t$ to D(s) so that:

$N(s) = (B_0 + B_1 + B_2 + B_3 + B4) + (4B_0 + 3B_1 + 2B_2 + B_3) \cdot$ $\qquad (\Omega/\Omega_0) \cdot (\Omega_0/s) + (6B_0 + 3B_1 + B_2) \cdot (\Omega/\Omega_0)^2 \cdot (\Omega_0/s)^2 +$ $\qquad (4B_0 + B_1) \cdot (\Omega/\Omega_0)^3 \cdot (\Omega_0/s)^3 + B_0 \cdot (\Omega/\Omega_0)^4 \cdot (\Omega_0/s)^4$ and $D(s) = ((1 + A_0) + A_1 + A_2 + A_3 + A_4) + (4(1 + A_0) +$ $\qquad 3A_1 + 2A_2 + A_3) \cdot (\Omega/\Omega_t) \cdot (\Omega_t s) + (6(1 + A_0) +$ $\qquad 3A_1 + A_2) \cdot (\Omega/\Omega_t)^2 \cdot (\Omega_t/s)^2 + (4(1 + A_0) + A_1) \cdot (\Omega/\Omega_t)^3 \cdot$ $\qquad (\Omega_t/s)^3 + (1 + A_0) \cdot (\Omega/\Omega_t)^4 \cdot (\Omega_t/s)^4$ The comparison of N(s) and D(s) with the expression for ES (s) yields $$EQ(s) = \frac{N(s)}{D(s)} = ES(s)$$

and then $B_0 + B_1 + B_2 + B_3 + B_4 = 1$
$(4B_0 + 3B_1 + 2B_2 + B_3) \cdot (\Omega/\Omega_0) = \delta_1$
$(6B_0 + 3B_1 + B_2) \cdot (\Omega/\Omega_0)^2 = \delta_2$ -continued $(4B_0 + B_1) \cdot (\Omega/\Omega_0)^3 = \delta_3$
$B_0 \cdot (\Omega/\Omega_0)^4 = 1$
and
$(1 + A_0) + A_1 + A_2 + A_3 + A_4) = 1$
$(4(1 + A_0) + 3A_1 + 2A_2 + A_3) \cdot (\Omega/\Omega_i) = \mu_1$
$(6(1 + A_0) + 3A_1 + A_2) \cdot (\Omega/\Omega_i)^2 = \mu_2$
$(4(1 + A_0) + A_1) \cdot (\Omega/\Omega_i)^3 = \mu_3$
$(1 + A0) \cdot (\Omega/\Omega_i)^4 = 1$ And after another algebraical transformation $1B_0 + 1B_1 + 1B_2 + 1B_3 + 1B_4 = 1$
$4B_0 + 3B_1 + 2B_2 + 1B_3 = \delta_1 \cdot (\Omega_0/\Omega)$
$6B_0 + 3B_1 + 1B_2 = \delta_2 \cdot (\Omega_0/\Omega)^2$
$4B_0 + 1B_1 = \delta_3 \cdot (\Omega_0/\Omega)^3$
$1B_0 = 1 \cdot (\Omega_0/\Omega)^4$
$1(1 + A_0) + 1A_1 + 1A_2 + 1A_3 + 1A_4 = 1$
$4(1 + A_0) + 3A_1 + 2A_2 + 1A_3 = \mu_1 \cdot (\Omega_i/\Omega)$
$6(1 + A_0) + 3A_1 + 1A_2 = \mu_2 \cdot (\Omega_i/\Omega)^2$
$4(1 + A_0) + 1A_1 = \mu_3 \cdot (\Omega_i/\Omega)^3$
$1(1 + A_0) = 1 \cdot (\Omega_i/\Omega)^4$ The two sets of linear equations above permit the model equalizer 22 coefficients $A_i$ and $B_i$ to be calculated, which is a routine task. There is no need to derive final separate equations for each of those coefficients because they can be calculated using known numerical methods of solving linear equations. The right hand sides of the equations above are known from speaker measurements and from designer target coefficients, a detailed example of which is given below. $\Omega$ can be chosen arbitrarily. There is, however, such a value of $\Omega$ which minimizes circuit sensitivity to component value variations. A close look at this set of equations reveals the well known pattern of Pascal's triangle but written in a modified order, as follows:

```
1   1   1   1   1
5   4   3   2   1
10  6   3   1
10  4   1
5   1
1
```

Thanks to this observation one skilled in the art can write the above sets of equations for any equalizer order.

If all the elementary filter blocks 24 have a low-pass configuration then it can be shown that the last set of equations can be rewritten in the form:

$1B_0 + 1B_1 + 1B_2 + 1B_3 + 1B_4 = 1 \cdot (\Omega_0/\Omega)^4$
$4B_0 + 3B_1 + 2B_2 + 1B_3 = \delta_3 \cdot (\Omega_0/\Omega)^3$
$6B_0 + 3B_1 + 1B_2 = \delta_2 \cdot (\Omega_0/\Omega)^2$
$4B_0 + 1B_1 = \delta_1 \cdot (\Omega_0/\Omega)$
$1B_0 = 1$
and
$1(1 + A_0) + 1A_1 + 1A_2 + 1A_3 + 1A_4 = 1 \cdot (\Omega_i/\Omega)^4$
$4(1 + A_0) + 3A_1 + 2A_2 + 1A_3 = \mu_3 \cdot (\Omega_i/\Omega)^3$
$6(1 + A_0) + 3A_1 + 1A_2 = \mu_2 \cdot (\Omega_i/\Omega)^2$
$4(1 + A_0) + 1A_1 = \mu_1 \cdot (\Omega_i/\Omega)$
$1(1 + A_0) = 1$ This set is similar to the previous one except that the right hand sides are in reverse order. The generalization technique is also similar. Any mixed combination of low and high pass first order filters leads to a similar set of linear equations which can easily be solved giving values for $A_i$ and $B_i$.

If n<m then some coefficients on the right hand sides of the equations are zeroes but the procedure for calculation remains the same.

METHOD FOR EQUALIZING A VENTED BOX LOUDSPEAKER SYSTEM

By way of example, the above described method is applied below for designing a model circuit 22 for equalizing a vented box loudspeaker system 14 as shown in FIG. 1.

A vented box loudspeaker system 14 can be modeled by fourth order high pass filter characteristics. Accordingly, the Laplace transform of the loudspeaker system response LS(s) is given by the following normalized equation:

$$LS(s) = \frac{1}{1 + \delta_1(\Omega o/s) + \delta_2(\Omega o/s)^2 + \delta_3(\Omega o/s)^3 + (\Omega o/s)^4}$$

As described earlier, the polynomial coefficients $\Omega$ for the above described equation are algebraic functions that may be determined by measuring the physical parameters of the loudspeaker system 14. The. Thiel-Small method is one technique known for establishing these parameters. Utilizing the known Thiel-Small method, the polynomial coefficients are determined by the following equations:

$\delta_1 = Rf/Qt + 1/(Rf*Qb)$ $\delta_2 = Rf^2 + (1+Vr)/Rf^2 + 1/(Qt*Qb)$ $\delta_3 = Rf/Qb + 1/(Rf*Qt)$ $\Omega o = 1/(\Omega s * \Omega b)^{1/2}$ where $Rf = (\Omega b/\Omega s)^{1/2}$ $Vr = Vas/Vb$ and where
   Qt—driver 18 total Q factor
   $\Omega$s—driver 18 free air angular resonance frequency
   Vas—equivalent volume of driver 18 suspensions
   Vb—box 20 volume
   Qb—vent and box 20 Q factor
   $\Omega$b—vent and box 20 angular resonance frequency It should be noted that the Thiel-Small technique, while theoretically simple, does contain some inaccuracies. These are typically caused by difficulties in measuring some parameters (for instance the vent and box 20 Q factor) and variances in parameters due to different working environments (for instance, when measuring driver 18 parameters in free air as opposed to in a box 20). For these reasons, the polynomial coefficients could alternatively be established in a more direct manner, i.e. from the frequency response of the loudspeaker system 14 measured in an anechoic chamber.

Referring to FIG. 3, the topology of two model circuits 22 for equalizing the response of a vented box loudspeaker system are shown. As noted above, the desired function can be obtained by cascaded high-pass or low-pass filters. In the first example, (FIG. 3a), the filter 24 comprises a combination of resistive and reactive elements, and in particular a first order R-C network arranged in a high pass configuration. In the second example, (FIG. 3b), the filter 24 comprises a first order R-C network arranged in a low pass configuration. In either case, four R-C networks are connected in cascade to correspond to the fourth order vented box loudspeaker system 14. The model circuit 22 also includes the output and feedback summing and scaling amplifiers 26 and 28 described above. The feedback amplifier utilizes the differential amplifier shown at 29. The unknown coefficients for the output amplifier 26 are represented as $B_0$ to $B_4$ and the unknown coefficients for the feedback amplifier 28 are identified as $A_0$ to $A_4$. These coefficients are determined using the 4th order equations as outlined above.

Figure 4:
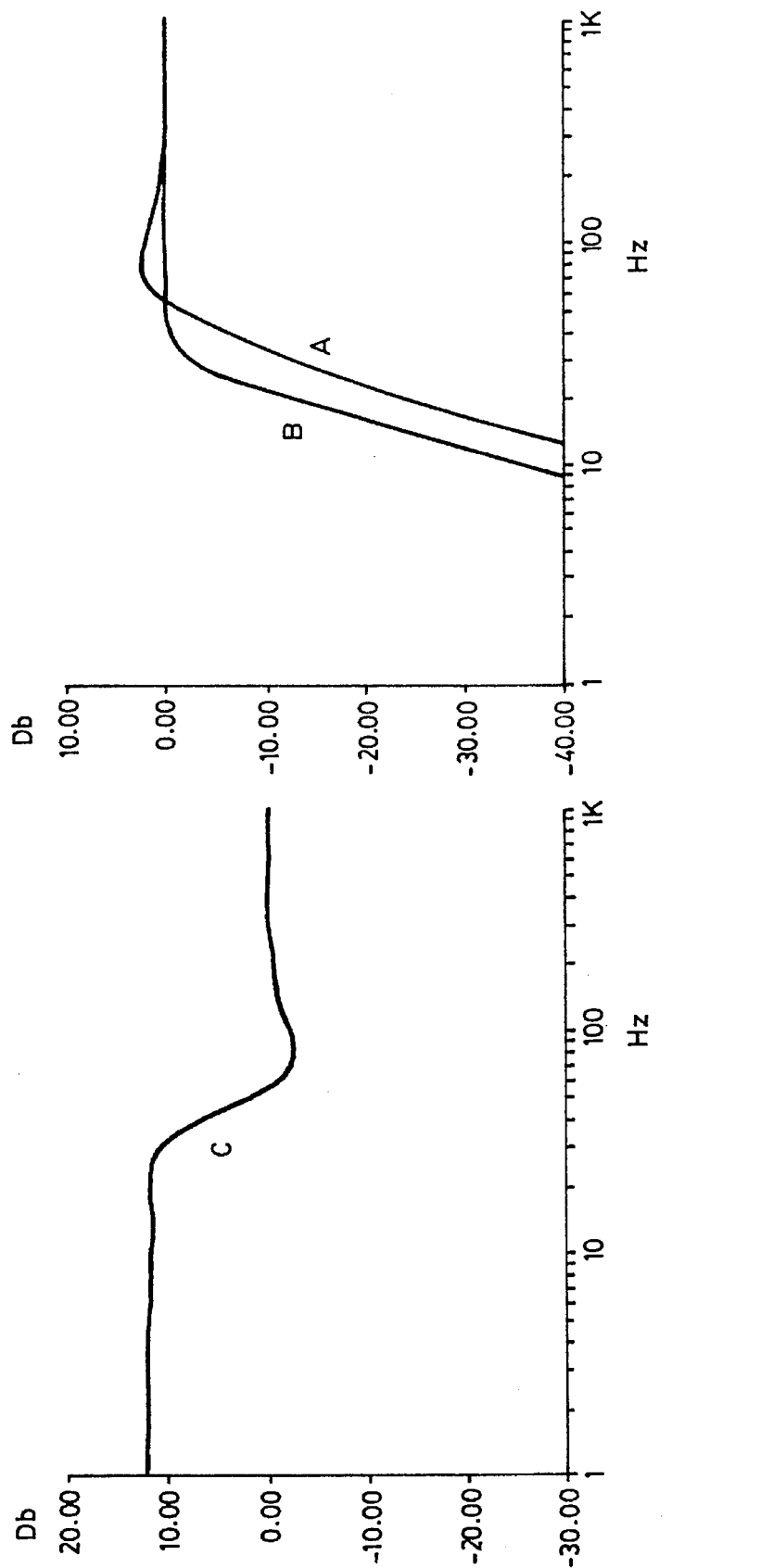
FIG. 4 is a pair of graphs of selected response functions.

Referring to FIG. 4, examples are shown of frequency response curves for a vented box system 14. Curve A represents the frequency response of the vented box loudspeaker system LS(s), showing a loudspeaker cutoff frequency. Curve B represents the overall target frequency response F(s), and curve C represents the equalizing circuit response EQ(s) for obtaining the target response. Curve C shows a target cutoff frequency which is lower than the loudspeaker cuttoff frequency. It will be seen that by utilizing curve C, the target response can be obtained which lowers the breakpoint or cutoff frequency and provides a flat response down to this frequency.

The model circuit 22 shown in FIG. 3a utilizes the R-C networks connected in a high pass configuration. One can demonstrate that the circuit 22 works in the same manner when R-C networks are connected in a low pass configuration in one or more of the circuit segments. Only the equations used to calculate the circuit components change and these are outlined above. Such alternate configurations may have some practical advantages. An example of an all low pass configuration is shown in FIG. 3b. Using the equations described above, the co-efficients A and B for the summing and scaling amplifiers 26, 28 can be determined to give the desired response.

CIRCUIT REALIZATIONS

Figure 5A:
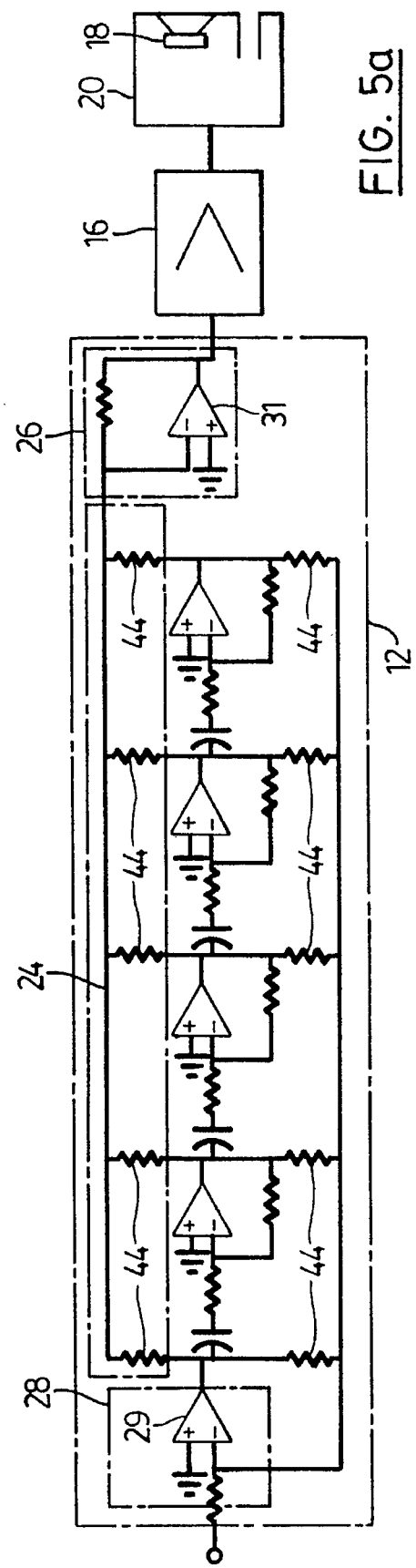
FIGS. 5(a) and (b) are circuit realizations of the model circuits depicted in FIGS. 3(a) and (b)

FIG. 5a and b shows two equivalent examples of equalizing circuits 12 that realize the model circuits 22 depicted in FIG. 3. The circuit 12 shown in FIG. 5a is a realization of the all high pass configuration shown in FIG. 3a, and the circuit 12 shown in FIG. 5b is a realization of the all low pass configuration shown in FIG. 3b.

Figure 5B:
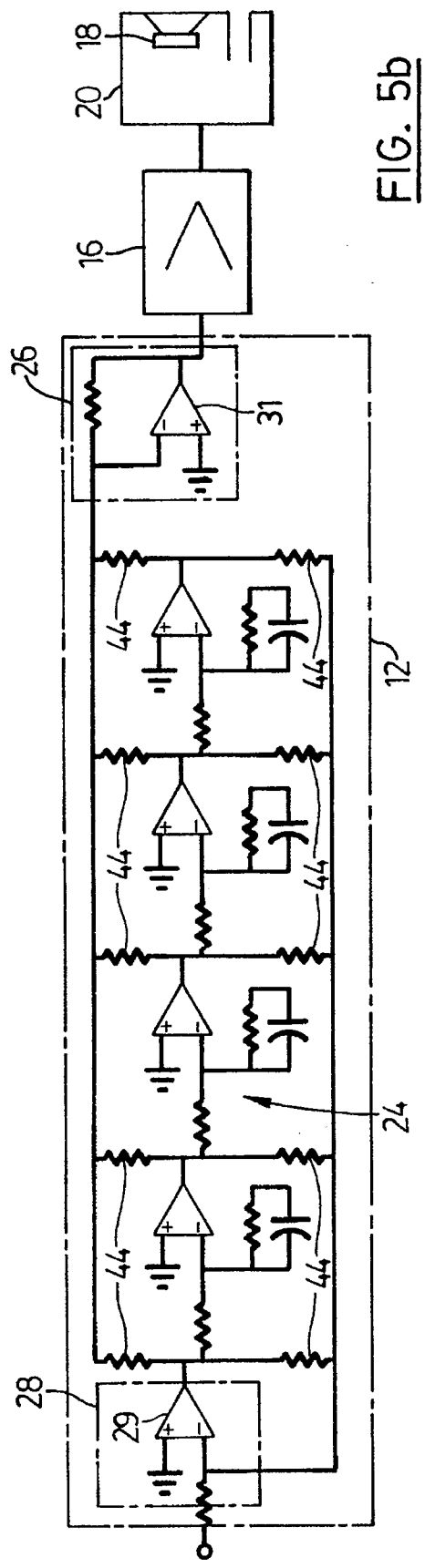

In each of FIGS. 5a and 5b, the output and feedback summing and scaling amplifiers 26 and 28 are indicated in dotted outline. The differential amplifier for the feedback amplifier 28 is shown at 29 and a differential amplifier for the output amplifier 26 is shown at 31. Each summing and scaling amplifier 26, 28 includes a resistor 44 connecting each input of the respective summing and scaling amplifier 26, 28. The values of the resistors 44 are defined by the A & B parameters of the model circuit 22.

It will be noted that some of the resistors 44 in the circuits 12 depicted in FIGS. 5a and 5b may be replaced by variable resistors to give the user an opportunity to adjust the system performance according to one's own preferences.

FIG. 5 shows more detailed 4th order versions of the general system shown in FIG. 3. If one is not concerned about the system absolute gain then it is possible to find values of all coefficients A and B assuming that $B_0=1$ and $A_0=0$. In some cases it just requires that, after initial calculations, all coefficients A are divided by $(1+A_0)$ and all coefficients B are divided by $B_0$.

The circuit design is at this stage quite simple. It is usually enough to chose only one resistor 44 value, for example 100 k$\Omega$, and find values for the remaining resistors 44 using coefficients A and B as proportional factors.

It will be appreciated that the equalizing circuit 12 may be comprised of a single circuit 12 or a combination of circuits 12 connected in cascade or parallel. Two circuits 12 could be used in parallel for example to equalize two sets of speakers 18 having different frequency response characteristics. Also, two or more circuits 12 could be connected in cascade to build up the circuit order to correspond to the speaker system 14 order. For instance, two 4th order circuits 12 could be connected in cascade to equalize an 8th order loudspeaker system 14. This could be desirable where such equalizing circuits 12 are pre-produced at a set order.

SELECTION OF FREQUENCY PARAMETERS

In designing the model circuit 22, it was earlier stated that the values for $\Omega$ may be arbitrarily selected. This is because $\Omega_o$ is a fifth parameter in a fourth order system. Nevertheless, certain values for $\Omega$ are preferred over others. The selection of these is described further below.

Figure 6:
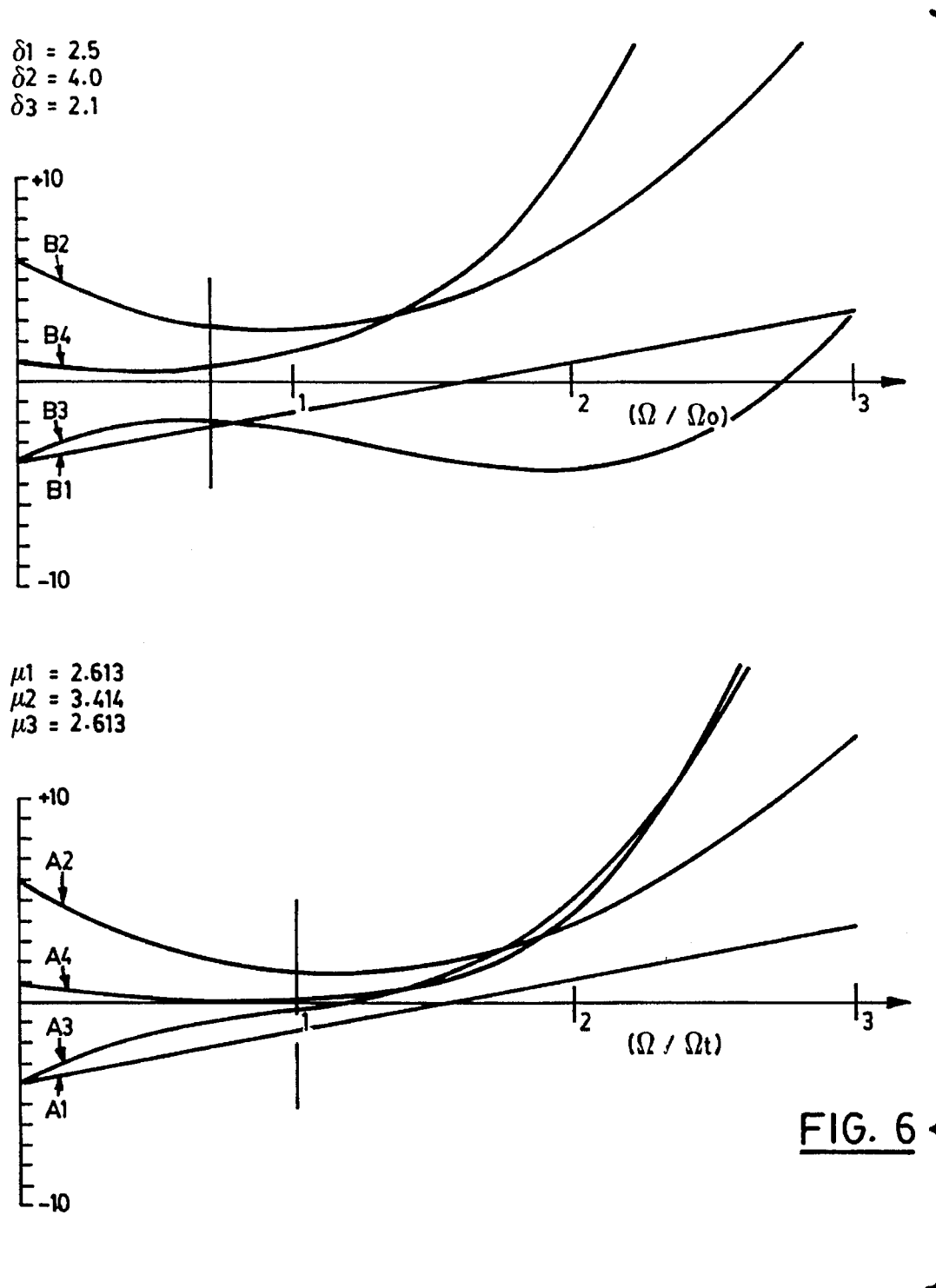
FIG. 6 is a pair of graphs depicting circuit parameters as a function of $\Omega$.

FIG. 6 shows graphs of the A and B parameters as functions of $\Omega$. The plots are based on the practical example used for the fourth order system equalized by the circuit shown in FIG. 5. In this example, the following values were assigned:

$\Omega=2\pi 28.3$ Hz $\Omega t=2\pi 28.3$ Hz $\Omega o=2\pi 40$

These values give approximately half an octave shift, which has been found is acceptable for a fourth order system, and requires just a 12 db (approximate) gain at low frequencies. For a sealed box system, which has a second order characteristic, the slope is half that for the fourth order system, so a greater frequency shift of around one octave could be provided, without requiring an excessively high gain at low frequencies.

The relationship between the frequency ratios $\Omega/\Omega o$ and $\Omega/\Omega t$, circuit coefficients A, B and target coefficients $\delta$, $\mu$ is shown in FIG. 6. The selected values of $\Omega$, $\Omega t$, and the above are indicated by vertical bars. The curves in FIG. 6 are plotted for the circuit in high pass configuration.

A number of important conclusions can be drawn from FIG. 6. First, it can be seen that there is a wide range of frequency ratios where appropriate coefficients of the circuits have the same sign. For example, for lower values of $\Omega/\Omega o$, $A_i$ has the same sign as $B_i$ for i=1, 2, 3 and 4. In addition, the signs change their polarity alternatively for these values. This allows one to simplify the practical realization of the circuit because there is no need for additional inverting stages and one can use only inverting buffers separating R-C segments of the circuit. Second, it can be seen that at frequency ratios around 1, the absolute values of the coefficients A and B are minimal. This therefore implies that the choice of $\Omega$ has an effect on circuit sensitivity to the variation of its components values and this sensitivity is minimal for the ratios around 1.

The circuits 12 depicted in FIG. 5 clearly show that the circuit 12 contains a very small number of components. There is no need in practice to modify the topology of the circuit 12. One can always choose $\Omega$ to match appropriate signs of a circuit coefficient to use the simple topology from FIG. 5.

CIRCUIT DESIGN STEPS

The equalizing circuit 12 may be designed by following the steps listed below.

1. Identify a speaker system 14 to be equalized and then:
   (a) identify the speaker system 14 order n (which can be done by knowing the kind of enclosure 20 in which a speaker 18 is mounted to, etc.);
   (b) identify coefficients $\delta_i$ of the speaker system 14 polynomial LS(s) and its reference frequency $\Omega_o$. In this case there are many techniques to follow. One of them is the Thiel-Small method described above in the example for a 4th order system. Alternatively, the polynomial coefficients are found from direct measurements of the speaker frequency response.

2. Define the parameters of the target response function F(s).
This includes selecting a target reference frequency $\Omega_t$, a target order m>n, and a set of target coefficients $\mu_i$. The normalized form of the polynomial allows for the use of tabularized coefficients of known polynomial shapes (eg. Butterworth) unless there are some other preferences.

3. Choose the kind of elementary filters 24 to be used in the model circuit 22 and select the common frequency $\Omega$.

The main concern in this step is to minimize the model circuit 22 sensitivity to its component value variations. As a general rule one can chose $\Omega$ to be between $\Omega_0$ and $\Omega_t$.

4. From the comparison of model circuit 22 equations ES(s) and EQ(s), calculate values of the right sides of appropriate sets of equations and, using the Pascal triangle, write left sides of those equations.

5. Solve equations finding circuit coefficients $A_i$ and $B_i$.

6. Construct equalizer circuit 12.

It is to be understood that what has been described are preferred embodiments of the invention. The invention is nonetheless susceptible to certain changes and alternative embodiments fully comprehended by the spirit of the invention as described above, and the scope of the claims set out below.

I claim:

1. In combination with a loudspeaker system having a known loudspeaker transfer function and a known loudspeaker cutoff frequency, a circuit adapted for generating a desired target response function having a target cutoff frequency below the loudspeaker cutoff frequency, the circuit comprising:

circuit means for generating a circuit transfer function having both a numerator and a denominator, wherein the numerator defines sufficient zeroes to cancel all of the poles of the transfer function of the loudspeaker system and wherein the poles of the target transfer function provide a target cutoff frequency below the loudspeaker cutoff frequency, whereby the desired target response function is obtained by combining the circuit transfer function and the loudspeaker transfer function and the cutoff frequency is lowered from the loudspeaker cutoff frequency to the target cutoff frequency, wherein the transfer function of the loudspeaker system is of order n and defines n poles, wherein the denominator and the numerator of the transfer function of the circuit are both of order m and respectfully define m zeroes and m poles, and wherein n is $\leq$ m, and wherein the circuit comprises an input, an output, an output summing and scaling amplifier connected to the output, a feedback summing and scaling amplifier connected to the input, and a plurality of filter elements connected in series to the output of the feedback amplifier, wherein the output of the feedback amplifier and the outputs of each of the filter elements are connected to inputs of both the output amplifier and the feedback amplifier, said amplifier inputs defining scaling factors for achieving the desired target response function.

2. A circuit as claimed in claim 1, wherein the filter elements comprise high-pass filters.

3. A circuit as claimed in claim 1, wherein the filter elements comprise low-pass filters.

4. A circuit as claimed in claim 2 or 3, wherein each filter element comprises an operational amplifier and a resistor and capacitor network connected to an input.

5. A circuit as claimed in claim 1, wherein each of said amplifier inputs includes a resistor whose value is selected to achieve said desired target response function.

6. An equalizing circuit as claimed in claim 5, wherein said filter elements are first order R-C networks.

7. A combination is claimed in claim 1, wherein the loudspeaker has a transfer function LS(s), with coefficients $\delta l$ and a reference frequency $\Omega_o$, wherein the target response function has a target response reference frequency $\Omega_t$, and a set of target coefficients $\mu_i$, wherein the filter elements have a common frequency $\Omega$, and wherein $\Omega$ is selected to minimize sensitivity of the target response function to variations in component values.

8. A combination is claimed in claim 7, wherein ratios of $\Omega:\Omega_o$ and $\Omega:\Omega_t$ are chosen such that circuit coefficients, determined from the target coefficients alternate in sign and the filter elements are connected by inverting buffers.

9. A combination is claimed in claim 7, wherein $\Omega$ is between $\Omega_o$ and $\Omega_t$.

10. A combination is claimed in claim 9, wherein both $\Omega:\Omega_o$ and $\Omega:\Omega_t$ are around one.

* * * * *